United States Patent
Lee et al.

(10) Patent No.: US 8,410,465 B2
(45) Date of Patent: Apr. 2, 2013

(54) APPARATUS AND METHOD FOR INSPECTING DEFECTS OF A CIRCUIT PATTERN FORMED ON A SUBSTRATE USING A LASER AND A NON-CONTACT CAPACITOR SENSOR

(75) Inventors: Seung Seoup Lee, Gyunggi-do (KR); Jae Cheon Doh, Gyunggi-do (KR); In Kyung Park, Daejeon (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 522 days.

(21) Appl. No.: 12/716,948

(22) Filed: Mar. 3, 2010

(65) Prior Publication Data
US 2011/0128011 A1 Jun. 2, 2011

(30) Foreign Application Priority Data
Dec. 2, 2009 (KR) .................. 10-2009-0118701

(51) Int. Cl.
*G01N 21/86* (2006.01)
(52) U.S. Cl. .................. 250/559.4; 250/559.34
(58) Field of Classification Search ............. 250/559.4, 250/559.34, 559.33, 559.42, 559.44, 559.45, 250/214.1, 214 R; 356/237.3–237.5; 324/759.02, 324/759.22, 759.3, 519, 750.17, 525, 756.04
See application file for complete search history.

(56) References Cited

U.S. PATENT DOCUMENTS 3,506,838 A * 4/1970 Offutt ................. 250/559.04
6,686,757 B1 2/2004 Ring et al.

FOREIGN PATENT DOCUMENTS

JP 2004-191282 7/2004
KR 10-2005-0002819 A 1/2005

OTHER PUBLICATIONS

Office Action from counterpart Korean Patent Application No. 10-2009-0118701, mailed Apr. 19, 2011, 5 pages.

* cited by examiner

*Primary Examiner* — Que T Le
(74) *Attorney, Agent, or Firm* — Blakely Sokoloff Taylor & Zafman LLP

(57) ABSTRACT

An apparatus for inspecting defects in a circuit pattern is described. The apparatus includes at least one laser unit for radiating a laser beam onto a first end of a circuit pattern formed on a substrate. The apparatus also includes a capacitor sensor disposed opposite a second end of the circuit pattern, which is connected to the first end of the circuit pattern through a via hole, in a non-contact manner. The apparatus also includes a voltage source connected to the capacitor sensor and configured to apply a voltage. The apparatus also includes a measurement unit connected to the capacitor sensor and configured to detect variation in impedance generated in the capacitor sensor.

14 Claims, 3 Drawing Sheets

APPARATUS AND METHOD FOR INSPECTING DEFECTS OF A CIRCUIT PATTERN FORMED ON A SUBSTRATE USING A LASER AND A NON-CONTACT CAPACITOR SENSOR

CROSS REFERENCE TO RELATED APPLICATION

This application claims the benefit of Korean Patent Application No. 10-2009-0118701, filed on Dec. 2, 2009, entitled "Inspection Apparatus and Method for Circuit Pattern of Substrate", which is hereby incorporated by reference in its entirety into this application.

BACKGROUND OF THE INVENTION

1. Technical Field

The present invention relates to an apparatus and method for inspecting defects in a circuit pattern.

2. Description of the Related Art

Recently, with the development of computer and communication technology, the transfer speed of signals in electronic devices has become an important parameter. Accordingly, decreasing impedance between parts and wires in a Printed Circuit Board (PCB) and matching the impedance therebetween have become very important. In order to realize low impedance, a PCB is designed such that fine wiring patterns are formed and wiring density is also increased.

Meanwhile, as wiring patterns on a PCB become fine, the open and short circuits of the wiring patterns may cause problems. Further, in order to check the reliability of wiring patterns formed on a PCB, whether wiring patterns have open- or short-circuited is tested.

As a demand for PCBs has increased, testing for wiring patterns on PCBs also requires high precision, high speed and low cost so that a large number of PCBs can be precisely and promptly tested. Meanwhile, although a requirement for high-reliability and high-speed measurement has increased, an effective method meeting such a requirement has not yet been proposed, and thus a method using probes is currently being used.

FIG. 1 is a sectional view showing a conventional apparatus for inspecting defects in a circuit pattern using contact probes. Hereinafter, a conventional apparatus and method for inspecting defects in a circuit pattern will be described with reference to FIG. 1.

The conventional apparatus for inspecting defects in a circuit pattern includes two pin probes 1 and 2, a voltage source 3 and an ammeter 4.

The first pin probe 1 is installed to come into contact with the circuit pattern 6 of a substrate 5, which is a target to be inspected, and is configured to input a voltage received from the voltage source 3 to the inspection target circuit pattern 6. Therefore, a conical portion of the first pin probe 1 is connected to the inspection target circuit pattern 6, and the portion of the first pin probe 1 which is opposite the conical portion is connected to the voltage source 3 through the lead wire of the first pin probe 1.

The second pin probe 2 is installed to come into contact with a connection circuit pattern 7, of which the electrical connection with the inspection target circuit pattern 6 is desired to be examined. Therefore, a conical portion of the second pin probe 2 is connected to the connection circuit pattern 7, and the portion of the second pin probe 2 which is opposite the conical portion is connected to the lead wire of the second pin probe 2.

The ammeter 4 is a component for measuring current flowing through a closed circuit, and is installed in series with lead wires connected to the first pin probe 1 and the second pin probe 2.

A conventional method of inspecting defects in a circuit pattern is described below.

When the inspection target circuit pattern 6 is normally connected to the connection circuit pattern 7, current flows from the voltage source 3 sequentially through the first pin probe 1, the inspection target circuit pattern 6, the connection circuit pattern 7, and the second pin probe 2. The current is measured by the ammeter 4, and the entire resistance can be measured by applying the current to the formula of Ohm's law, that is, $R=V/I$. Theoretically, when the inspection target circuit pattern 6 is normally connected to the connection circuit pattern 7, the resistance must be '0'. However, since there are resistances of the lead wires and the pin probes 1 and 2 themselves, the entire resistance is not '0' and is derived as a relatively small value.

In contrast, when the inspection target circuit pattern 6 is not normally connected to the connection circuit pattern 7, current does not flow through a closed circuit, and the resistance becomes infinite.

Accordingly, the above resistances are compared with each other, and thus whether defects are present in the circuit pattern can be examined.

However, as described above, in the case when the contact pin probes 1 and 2 are used both in the inspection target circuit pattern 6 and in the connection circuit pattern 7, even if the circuit patterns are not normally connected, the circuit patterns may be measured as if they were normally connected to each other due to the contact pressure of the pin probes 1 and 2. That is, there is a problem in that the occurrence of erroneous measurements may increase.

Further, there is a problem in that the pin probes 1 and 2 come into contact with all unit circuit patterns, thus increasing the time required for measurements.

SUMMARY OF THE INVENTION

Accordingly, the present invention has been made keeping in mind the above problems occurring in the prior art, and the present invention is intended to provide a non-contact apparatus and method for inspecting defects in a circuit pattern, in which a laser beam is radiated onto one end of a circuit pattern, and variation in the impedance of a capacitor sensor, attributable to surface acoustic waves which are transferred to the capacitor sensor after passing through the other end of the circuit pattern, is measured, thus measuring the open/short circuits of the circuit pattern.

In accordance with an aspect of the present invention, there is provided an apparatus for inspecting defects in a circuit pattern, comprising at least one laser unit for radiating a laser beam onto a first end of a circuit pattern formed on a substrate, a capacitor sensor disposed opposite a second end of the circuit pattern, which is connected to the first end of the circuit pattern through a via hole, in a non-contact manner, a voltage source connected to the capacitor sensor and configured to apply a voltage, and a measurement unit connected to the capacitor sensor and configured to detect variation in impedance generated in the capacitor sensor.

Further, the laser unit is a femtosecond laser.

Further, the laser unit is implemented as a plurality of laser units.

Further, the substrate is a printed circuit board or a semiconductor wafer.

Further, the capacitor sensor is a thin metal film.

Further, the capacitor sensor is disposed opposite the second end of the circuit pattern in parallel with the second end in a non-contact manner.

In accordance with another aspect of the present invention, there is provided a method of inspecting defects in a circuit pattern, comprising (a) disposing at least one laser unit over a first end of a circuit pattern formed on a substrate, and disposing a capacitor sensor to be opposite a second end of the circuit pattern, which is connected to the first end of the circuit pattern through a via hole, in a non-contact manner, (b) applying a voltage to the capacitor sensor, (c) the laser unit radiating a laser beam onto the first end of the circuit pattern, and (d) measuring variation in impedance generated in the capacitor sensor.

Further, at (a), the laser unit is a femtosecond laser.

Further, at (a), the laser unit is implemented as a plurality of laser units.

Further, at (a), the substrate is a printed circuit board or a semiconductor wafer.

Further, at (a), the capacitor sensor is disposed opposite the second end of the circuit pattern in parallel with the second end in a non-contact manner.

Further, at (b), the capacitor sensor is a thin metal film.

Further, at (d), the measurement of the variation in impedance is performed by measuring voltage variation or current variation occurring in the capacitor sensor.

Further, at (b), an Alternating Current (AC) voltage is applied, at (c), surface acoustic waves are generated by the laser beam and are transferred to the second end of the circuit pattern, which is connected to the first end through the via hole, and at (d), the variation in impedance generated in the capacitor sensor is measured using frequency of the AC voltage and frequency of the surface acoustic waves.

DESCRIPTION OF THE PREFERRED EMBODIMENTS

Figure 1:
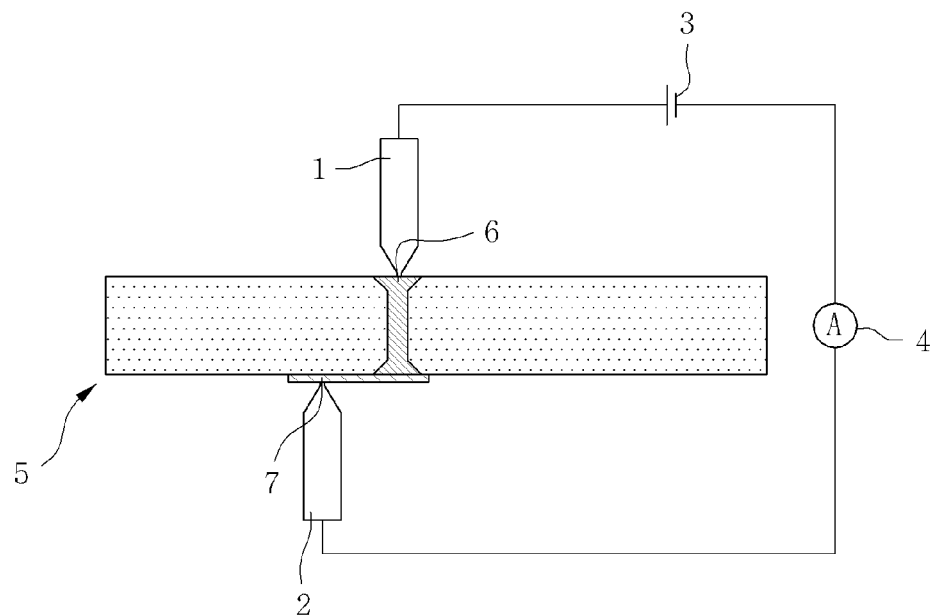
FIG. 1 is a sectional view showing a conventional apparatus for inspecting defects in a circuit pattern using pin probes.

Prior to giving the description, the terms and words used in the present specification and claims should not be interpreted as being limited to their typical meaning based on the dictionary definitions thereof, but should be interpreted to have the meaning and concept relevant to the technical spirit of the present invention, on the basis of the principle by which the inventor can suitably define the implications of terms in the way which best describes the invention.

The above and other objects, features and advantages of the present invention will be more clearly understood from the following detailed description taken in conjunction with the accompanying drawings. In the present specification, reference now should be made to the drawings, in which the same reference numerals are used throughout the different drawings to designate the same or similar components. Further, in the description of the present invention, if detailed descriptions of related well-known constructions or functions are determined to make the gist of the present invention unclear, the detailed descriptions will be omitted.

Hereinafter, embodiments of the present invention will be described in detail with reference to the attached drawings.

Figure 2:
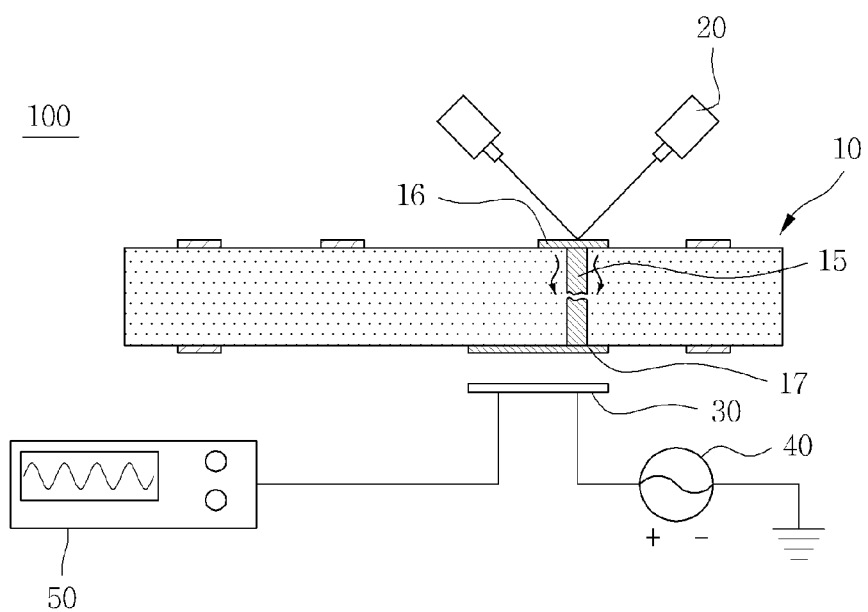
FIG. 2 is a schematic view showing the state in which an apparatus for inspecting defects in a circuit pattern according to an embodiment of the present invention is disposed on a defective circuit pattern and operated thereon.
Figure 3:
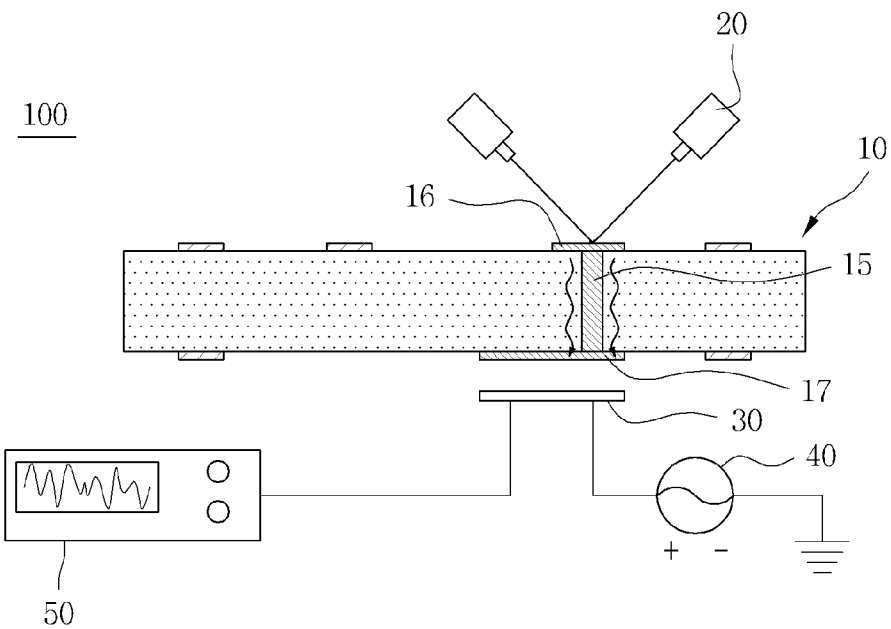
FIG. 3 is a schematic view showing the state in which the apparatus for inspecting defects in a circuit pattern according to an embodiment of the present invention is disposed on a non-defective circuit pattern and operated thereon.
Figure 4:
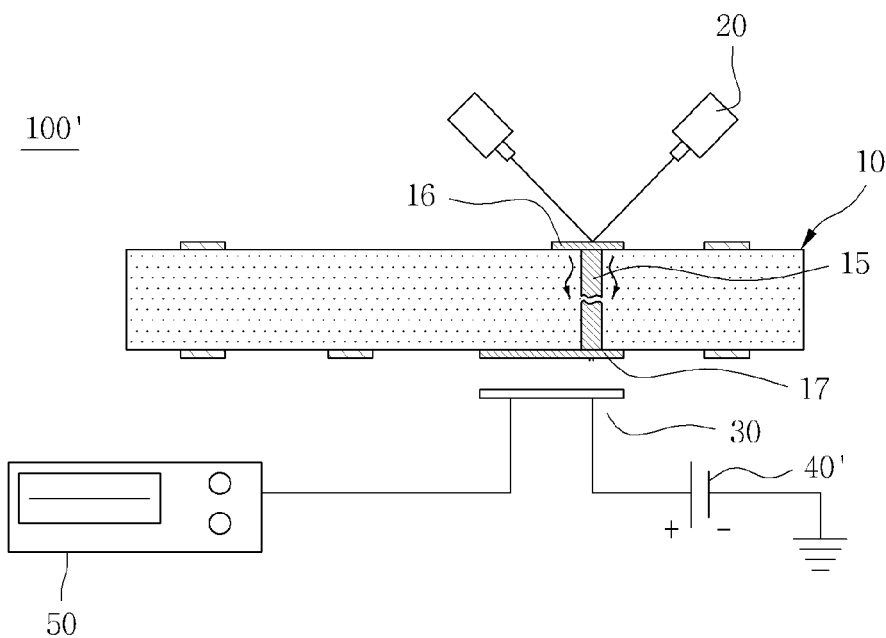
FIG. 4 is a schematic view showing the state in which an apparatus for inspecting defects in a circuit pattern according to another embodiment of the present invention is disposed on a defective circuit pattern and operated thereon.
Figure 5:
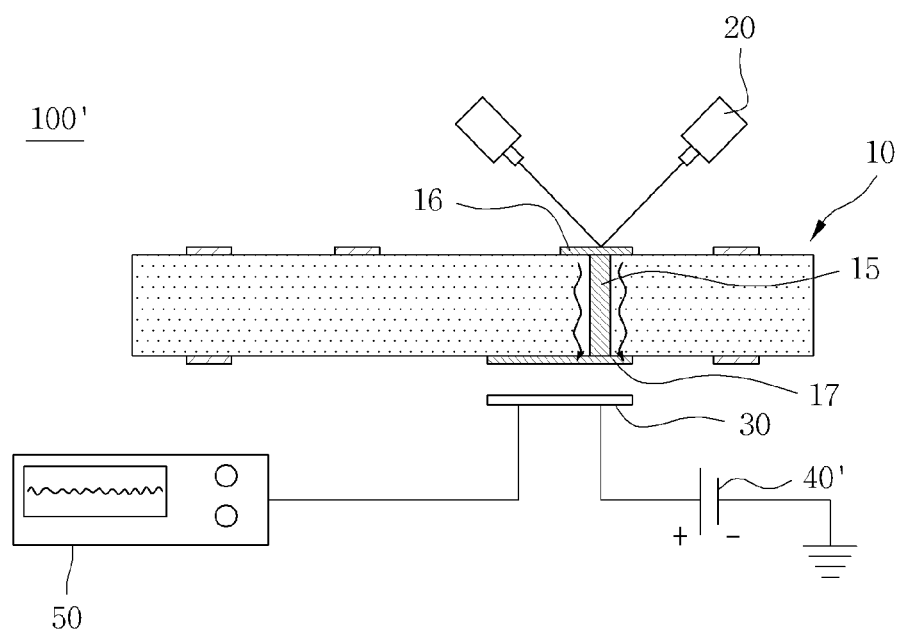
FIG. 5 is a schematic view showing the state in which the apparatus for inspecting defects in a circuit pattern according to another embodiment of the present invention is disposed on a non-defective circuit pattern and operated thereon.

FIG. 2 is a schematic view showing the state in which an apparatus for inspecting defects in a circuit pattern according to an embodiment of the present invention is disposed on a defective (open) circuit pattern and operated thereon. FIG. 3 is a schematic view showing the state in which the apparatus for inspecting defects in a circuit pattern according to an embodiment of the present invention is disposed on a non-defective circuit pattern and operated thereon. FIGS. 4 and 5 are views showing a modification of the apparatus of FIGS. 2 and 3 for inspecting defects in a circuit pattern.

Hereinafter, an apparatus 100 for inspecting defects in a circuit pattern (hereinafter referred to as an 'inspection apparatus') according to the present embodiment will be described in detail with reference to the drawings.

As shown in FIG. 2, the inspection apparatus 100 includes laser units 20 which are disposed over one end 16 of a circuit pattern formed on a substrate 10, a capacitor sensor 30 which is disposed below the other end 17 of the circuit pattern, and a voltage source 40 and a measurement unit 50 which are connected to the capacitor sensor 30. The inspection apparatus 100 measures defects (open/short circuits) in the circuit pattern.

As shown in FIG. 2, the inspection apparatus 100 according to the present invention is intended to measure defects in a circuit pattern for which it is difficult to determine on the basis of the external appearance of the circuit pattern whether defects are present, among circuit patterns formed on the substrate 10. The substrate 10 includes circuit patterns as targets to be inspected by the inspection apparatus 100, and may include a semiconductor wafer as well as a Printed Circuit Board (PCB).

The circuit pattern of FIG. 2 has a shape in which one end 16 and the other end 17 of the circuit pattern are disposed on opposite sides of the substrate and are connected to each other through a via hole 15. However, this pattern shape is only an example. Therefore, the inspection apparatus 100 of the present invention can also be applied to a circuit pattern, one end 16 and the other end 17 of which are disposed on the same side of the substrate 10 and are connected to each other through a via hole and inner circuit layers.

As shown in FIG. 2, the laser units 20 radiate laser beams onto one end 16 of the circuit pattern formed on the substrate.

The laser units 20 are disposed over one end 16 of the circuit pattern and do not come into contact with the circuit pattern. In this case, the laser beams are preferably radiated onto a land part that may be formed at one end 16 of the circuit pattern.

The laser beams radiated by the laser units 20 generate surface acoustic waves on the surface of the circuit pattern. As the laser beams reach one end 16 of the circuit pattern which is a target to be inspected, the optical energy of the laser beams is converted into photoacoustic energy, and surface acoustic waves are generated on the circuit pattern. The generated surface acoustic waves have the form of standing waves rather than traveling waves, thus resulting in grating effects.

In this case, when defects are not present in the circuit pattern, the surface acoustic waves generated at one end 16 of the circuit pattern are transferred to the other end 17 of the circuit pattern after passing through the via hole 15. In contrast, when defects are present in the circuit pattern, surface acoustic waves are not transferred to the other end 17 of the circuit pattern. Meanwhile, even if defects are present in the circuit pattern, part of the surface acoustic waves may pass through a defective portion and may be transferred to the other end 17 of the circuit pattern. However, even in that case, the intensity of the transferred surface acoustic waves is relatively insignificant and is negligible.

In this case, each of the laser units 20 is preferably implemented as a femtosecond laser. In order to precisely measure defects in the circuit pattern, the intensity of the surface acoustic waves generated by the laser beams must be sufficiently high. When the laser unit 20 is implemented as a high-power laser, such high intensity can be achieved. A femtosecond laser has a pulse width of more than about several femtoseconds, and is capable of outputting instantaneous power in terawatts, and thus it can be employed in the preset invention.

Further, an Nd:YAG laser may be used as the laser unit. Such an Nd:YAG laser is a high-power laser which is implemented using a flashlamp or a laser diode, outputs a power of 20 megawatts in Q-switch mode, and has a pulse width of 10 nanoseconds.

Further, as shown in FIG. 2, the laser unit 20 may be implemented using a plurality of laser units. In FIG. 2, the embodiment in which two laser units 20 are employed in the laser unit 20 is shown, but this is only an example and may be modified and implemented.

As described above, in order to radiate a high-power laser beam onto one end 16 of the circuit pattern, a high-power laser may be used. Alternatively, even if laser beams having slightly low energy are radiated, a plurality of laser units 20 may be employed to radiate a high-power laser beam onto the circuit pattern.

As shown in FIG. 2, the capacitor sensor 30 is disposed opposite the other end 17 of the circuit pattern, which is connected to one end 16 of the circuit pattern through the via hole 15, in a non-contact manner. Since the capacitor sensor 30 does not come into contact with the substrate 10, as in the case of the laser unit 20, the inspection apparatus 100 of the present invention is implemented in a completely non-contact manner. Therefore, the inspection apparatus 100 can be installed in a non-contact manner, so that the consumption of pin probes can be reduced, the frequency of erroneous measurements caused by the concealment of the separation of electrodes occurring in a conventional contact method can decrease. Further, there is no need to come into contact with unit circuit patterns, so that precise measurement can be conducted even on fine circuit patterns.

The capacitor sensor 30 is a conductive plate made of metal, is connected to the voltage source 40 and the measurement unit 50, which will be described later, and is configured to receive surface acoustic waves that are to be transferred to the other end 17 of the circuit pattern. In this case, the other end 17 of the circuit pattern functions as the conductive plate of a capacitor corresponding to the capacitor sensor 30, together with a circuit layer which is formed on the surface of the substrate 10 and is connected to the other end 17 of the circuit pattern.

In this case, air present between the other end 17 of the circuit pattern and the capacitor sensor 30 functions to form a dielectric layer between two conductive plates 17 and 30 of the capacitor sensor, and acts as a medium for transferring the surface acoustic waves from the other end 17 of the circuit pattern to the capacitor sensor 30.

When the surface acoustic waves are transferred to the capacitor sensor 30, they influence the impedance of the capacitor sensor 30. Variation in the impedance of the capacitor sensor 30 attributable to the surface acoustic waves will be described in detail later in a method of inspecting defects in a circuit pattern.

Here, the capacitor sensor 30 is preferably implemented as a thin metal film. When the capacitor sensor 30 is implemented as a thin metal film, it sensitively reacts to surface acoustic waves, so that the degree of the impedance variation increases, and thus whether defects are present in the circuit pattern can be easily measured.

Further, the capacitor sensor 30 is preferably disposed opposite the other end 17 of the circuit pattern, the defects of which are to be inspected, in a non contact manner. In this case, the variation in the impedance of the capacitor sensor 30, attributable to the influence of the surface acoustic waves transferred to the capacitor sensor 30, can be received without causing loss attributable to other noise factors (for example, non-parallelism between the electrodes of the capacitor sensor or the like).

Further, the area of the capacitor sensor 30 is preferably wider than that of the other end 17 of the circuit pattern, the defects of which are to be inspected. This is also intended to receive the surface acoustic waves transferred to the capacitor sensor 30 without loss.

As shown in FIG. 2, the voltage source 40 is connected to the capacitor sensor 30 and is configured to apply a voltage thereto. The measurement unit 50 is connected to the capacitor sensor 30 and is configured to measure variation in impedance generated in the capacitor sensor 30.

When the voltage is applied by the voltage source 40, electric charges are moved through the capacitor sensor 30 acting as a resistor, and the measurement unit 50 measures current. In this case, when laser beams are not radiated by the laser units 20, surface acoustic waves are not transferred to the capacitor sensor 30, and a current value (or an impedance value) at that time is used as a reference current value (or a reference impedance value).

In FIGS. 2 and 3, an example in which the voltage source 40 applies an Alternating Current (AC) voltage is shown.

When defects are present in the circuit pattern, as shown in FIG. 2, the measurement unit 50 measures an AC current value, which is identical to the reference current value obtained when laser beams are not radiated.

Meanwhile, when laser beams are radiated onto a non-defective circuit pattern, as shown in FIG. 3, surface acoustic waves are transferred to the other end 17 of the circuit pattern, and thus surface acoustic waves are generated on the surface of the other end 17 of the circuit pattern. Accordingly, at the other end 17 of the circuit pattern constituting the capacitor and functioning as an upper conductive plate, the distance between the other end 17 of the circuit pattern and the capacitor sensor 30 varies due to the influence of the vibration of the standing waves on the surface attributable to the surface acoustic waves. As a result, the entire impedance of the capacitor sensor 30 varies, and the current value measured by the measurement unit 50 becomes different from the reference current value. In particular, the amplitude and period of the measured current value become different from those of the reference current value. In this way, the reference current value is compared with the measured current value, and thus defects in the circuit pattern are measured.

FIGS. 4 and 5 are views showing a modification of the inspection apparatus of FIGS. 2 and 3, and illustrate an example in which a voltage source 40' applies a DC voltage.

When defects are present in a circuit pattern, as shown in FIG. 4, the measurement unit 50 measures a constant current, which is identical to the reference current value obtained when laser beams are not radiated.

Meanwhile, when laser beams are radiated onto a non-defective circuit pattern, as shown in FIG. 5, surface acoustic waves are transferred to the other end 17 of the circuit pattern through the via hole 15, and thus surface acoustic waves are generated on the surface of the other end 17. As a result, the surface acoustic waves are transferred to the surface of the other end 17 of the circuit pattern, which constitutes the capacitor and functions as an upper conductive plate. Accordingly, the impedance of the surface of the other end 17 of the circuit pattern varies as the distance between the surface of the other end 17 and the capacitor sensor 30 slightly varies with time due to the influence of surface vibration of the standing waves of the surface acoustic waves. Furthermore, since the surface acoustic waves are transferred to the capacitor sensor 30 via an air layer, the current value measured by the measurement unit 50 becomes different from the reference current value due to the influence of the surface acoustic waves. In particular, a constant current is not measured, and a current value having a non-uniform waveform is measured.

In this case, the measurement unit 50 is connected in series with the capacitor sensor 30 and is configured to measure variation in a current value, thus measuring variation in the impedance of the capacitor sensor 30, and determining whether defects are present in the circuit pattern. However, this scheme is only one example of measuring the impedance variation of the capacitor sensor 30. Accordingly, it is possible that the measurement unit 50 is connected in parallel with the capacitor sensor 30 and measures the impedance variation of the capacitor sensor 30 by measuring variation in the voltage of the capacitor sensor 30.

Hereinafter, a method of inspecting defects in a circuit pattern according to an embodiment of the present invention will be described.

The laser units 20 are disposed over one end 16 of the circuit pattern which is formed on the substrate 10 and which is the target to be inspected. The capacitor sensor 30 is disposed opposite the other end 17 of the circuit pattern, which is connected to one end 16 of the circuit pattern through the via hole 15, in a non-contact manner. In this case, the substrate 10 may be a printed circuit board or a semiconductor wafer.

The structure in which the capacitor sensor 30 is disposed closest to the other end 17 of the circuit pattern without coming into contact with the other end 17 increases the impedance of the capacitor sensor 30, thus facilitating the improvement of sensitivity.

Further, such a laser unit 20 is preferably implemented as a femtosecond laser or a plurality of laser units 20 so as to radiate a high-power laser beam onto the circuit pattern. In particular, in order to radiate laser beams meeting at one location, it is preferable that a pair of laser units 20 simultaneously radiate laser beams.

Further, the capacitor sensor 30 is preferably disposed in parallel with the other end 17 of the circuit pattern. In this case, the capacitor sensor 30 can receive impedance variation attributable to the influence of surface acoustic waves transferred to the capacitor sensor 30 without undergoing loss due to other noise factors (for example, non-parallelism between the electrodes of the capacitor sensor or the like).

Further, the capacitor sensor 30 is preferably implemented as a thin metal film. The reason for this is that a thin metal film sensitively reacts to the influence of surface acoustic waves transferred through the other end 17 of the circuit pattern, thus easily measuring the impedance variation of the capacitor sensor 30.

Next, an AC voltage is applied to the capacitor sensor 30. When the voltage source 40 connected to the capacitor sensor 30 applies an AC voltage to the capacitor sensor 30, the capacitor sensor 30 acts as a resistor. Current flowing through the capacitor sensor 30 at that time is measured by the measurement unit 50 connected to the capacitor sensor 30. This current value is the reference current value required to determine whether defects are present in the circuit pattern.

In this case, the voltage applied to the capacitor sensor 30 is either AC or DC voltage. When AC voltage is applied, the reference current value is a sinusoidal AC current value. When DC voltage is applied, the reference current value is a DC current value having a constant magnitude.

Further, the laser units 20 radiate laser beams onto one end 16 of the circuit pattern. The laser beams radiated onto one end 16 of the circuit pattern generate surface acoustic waves on the surface of the circuit pattern. The generated surface acoustic waves are moved to the other end 17 of the circuit pattern, which is connected to one end 16 through the via hole 15.

When defects are present in the circuit pattern, surface acoustic waves are not transferred to the other end 17 of the circuit pattern, but are absorbed into surrounding insulating layers and circuit layers and are then extinguished.

In contrast, when defects are not present in the circuit pattern, the surface acoustic waves are finally transferred to the capacitor sensor 30.

Thereafter, variation in the impedance of the capacitor sensor 30 is measured. Such variation is measured by examining the variation in the current value measured by the measurement unit 50 after the laser beams are radiated onto one end 16 of the circuit pattern.

When defects are present in the circuit pattern, surface acoustic waves are not transferred to the capacitor sensor 30, so that the current value measured by the measurement unit 50 is identical to the reference current value.

In contrast, when defects are not present in the circuit pattern, surface acoustic waves are transferred to the surface of the other end 17 of the circuit pattern via the circuit pattern. Accordingly, the impedance of the surface of the other end 17 of the circuit pattern varies as the distance between the surface of the other end 17 of the circuit pattern and the capacitor sensor 30 slightly varies with time due to the influence of surface vibration of the standing waves of the surface acoustic waves. Furthermore, the surface acoustic waves are transferred to the capacitor sensor 30 through an air layer, and thus the current value measured by the measurement unit 50 becomes different from the reference current value due to the influence of the surface acoustic waves.

In particular, in order to improve measurement sensitivity, it is preferable to apply AC voltage, transfer surface acoustic waves to the other end 17 of the circuit pattern, connected to one end 16 of the circuit pattern through the via hole 157, and measure impedance variation of the capacitor sensor 30 using the frequency of the AC voltage and the frequency of the surface acoustic waves.

In general, the current value occurring in the resistor (capacitor sensor) is related to the impedance (resistance value) of the resistor. When defects are not present in the circuit pattern, a current value different from the reference current value is measured by the capacitor sensor 30 due to the influence of the surface acoustic waves, which indicates that the impedance of the capacitor sensor 30 has varied.

For example, a current value, measured when AC voltage is applied by the voltage source, is an AC current value, the amplitude and period of which are different from those of the reference current value. Further, a current value, measured when a DC voltage is applied, is a current value, the magnitude of which is different from that of the reference current value, or is not a constant current value. The reason for this is that, as described above, the impedance of the capacitor sensor 30 is influenced by the surface acoustic waves.

In the above embodiment, the method of measuring the impedance variation of the capacitor sensor 30 attributable to the surface acoustic waves by measuring current variation has been described. However, it is also possible to connect the voltage source in parallel with the capacitor sensor 30 and to measure the impedance variation of the capacitor sensor 30 by measuring variation in the voltage of the capacitor sensor 30.

Further, the method of inspecting defects in a circuit pattern according to the present invention can sequentially inspect defects present in a plurality of circuit patterns while moving the laser units 20 and the capacitor sensor 30.

As described above, an apparatus for inspecting defects in a circuit pattern according to the present invention is advantageous in that, unlike a contact inspection apparatus using pin probes, inspection is performed in a non-contact manner, thus reducing the consumption of pin probes.

Further, the present invention is advantageous in that erroneous measurements occurring in a contact inspection scheme using pin probes can be prevented.

Furthermore, a method of inspecting defects in a circuit pattern according to the present invention is advantageous because laser units and a capacitor sensor can be sequentially moved, and the open/short circuits of a plurality of circuit patterns can be inspected at one time, thus reducing the time required for inspection.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for inspecting defects in a circuit pattern, comprising:
    at least one laser unit for radiating a laser beam onto a first end of a circuit pattern formed on a substrate;
    a capacitor sensor disposed opposite a second end of the circuit pattern, which is connected to the first end of the circuit pattern through a via hole, in a non-contact manner;
    a voltage source connected to the capacitor sensor and configured to apply a voltage; and
    a measurement unit connected to the capacitor sensor and configured to detect variation in impedance generated in the capacitor sensor.

2. The apparatus as set forth in claim 1, wherein the laser unit is a femtosecond laser.

3. The apparatus as set forth in claim 1, wherein the laser unit is implemented as a plurality of laser units.

4. The apparatus as set forth in claim 1, wherein the substrate is a printed circuit board or a semiconductor wafer.

5. The apparatus as set forth in claim 1, wherein the capacitor sensor is a thin metal film.

6. The apparatus as set forth in claim 1, wherein the capacitor sensor is disposed opposite the second end of the circuit pattern in parallel with the second end in a non-contact manner.

7. A method of inspecting defects in a circuit pattern, comprising:
    (a) disposing at least one laser unit over a first end of a circuit pattern formed on a substrate, and disposing a capacitor sensor to be opposite a second end of the circuit pattern, which is connected to the first end of the circuit pattern through a via hole, in a non-contact manner;
    (b) applying a voltage to the capacitor sensor;
    (c) the laser unit radiating a laser beam onto the first end of the circuit pattern; and
    (d) measuring variation in impedance generated in the capacitor sensor.

8. The method as set forth in claim 7, wherein at (a), the laser unit is a femtosecond laser.

9. The method as set forth in claim 7, wherein at (a), the laser unit is implemented as a plurality of laser units.

10. The method as set forth in claim 7, wherein at (a), the substrate is a printed circuit board or a semiconductor wafer.

11. The method as set forth in claim 7, wherein at (a), the capacitor sensor is disposed opposite the second end of the circuit pattern in parallel with the second end in a non-contact manner.

12. The method as set forth in claim 7, wherein at (b), the capacitor sensor is a thin metal film.

13. The method as set forth in claim 7, wherein at (d), the measurement of the variation in impedance is performed by measuring voltage variation or current variation occurring in the capacitor sensor.

14. The method as set forth in claim 7, wherein:
    at (b), an Alternating Current (AC) voltage is applied;
    at (c), surface acoustic waves are generated by the laser beam and are transferred to the second end of the circuit pattern, which is connected to the first end through the via hole; and
    at (d), the variation in impedance generated in the capacitor sensor is measured using frequency of the AC voltage and frequency of the surface acoustic waves.

* * * * *